US012681046B2

(12) United States Patent
Kurachi

(10) Patent No.: US 12,681,046 B2
(45) Date of Patent: Jul. 14, 2026

(54) PROBE PASSING METHOD AND PROBE

(71) Applicant: JAPAN ELECTRONIC MATERIALS CORPORATION, Hyogo (JP)

(72) Inventor: Akihito Kurachi, Hyogo (JP)

(73) Assignee: JAPAN ELECTRONIC MATERIALS CORPORATION, Hyogo (JP)

( * ) Notice: Subject to any disclaimer, the term of this patent is extended or adjusted under 35 U.S.C. 154(b) by 156 days.

(21) Appl. No.: 18/727,347

(22) PCT Filed: Mar. 31, 2022

(86) PCT No.: PCT/JP2022/016456
§ 371 (c)(1),
(2) Date: Jul. 9, 2024

(87) PCT Pub. No.: WO2023/188243
PCT Pub. Date: Oct. 5, 2023

(65) Prior Publication Data
US 2025/0180605 A1 Jun. 5, 2025

(51) Int. Cl.
*G01R 3/00* (2006.01)
*G01R 1/067* (2006.01)

(52) U.S. Cl.
CPC ........... *G01R 3/00* (2013.01); *G01R 1/06716* (2013.01)

(58) Field of Classification Search
None
See application file for complete search history.

(56) References Cited

U.S. PATENT DOCUMENTS 6,577,145 B2 * 6/2003 Okuno ............... G01R 1/07364
324/756.03
2005/0110510 A1 5/2005 Brandorff
2018/0088150 A1 * 3/2018 Kuga ................. G01R 1/07314

FOREIGN PATENT DOCUMENTS

JP 9-219268 A 8/1997
JP 2001099863 A 4/2001
(Continued)

OTHER PUBLICATIONS

International Search Report and Written Opinion issued in corresponding International Patent Application No. PCT/JP2022/016456 (with English translation of International Search Report) mailed Jun. 14, 2022 (6 pages).

*Primary Examiner* — Farhana A Hoque
(74) *Attorney, Agent, or Firm* — Kilyk & Bowersox, P.L.L.C.

(57) ABSTRACT

[Problem] To facilitate passing of a probe through two or more guide plates. [Solution] Provided is a probe passing method for a probe card 1 in which two guide plates 301, 302 are spaced apart from each other, and a probe 50 is passed through two guide holes 311, 312 respectively formed in the two guide plates 301, 302, the method comprising: a step for passing a towing rod 60 through the two guide holes 311, 312; a step for separably linking the tip-end of the towing rod 60, having passed through the two guide holes 311, 312, to a linking portion 510 provided at the tip-end of the probe 50; a step for pulling the towing rod 60 out of the receiving two guide holes 311, 312, and passing the probe 50 through the two guide holes 311, 312; and a step for separating the towing rod 60, having been pulled out of the two guide holes 311, 312, from the probe 50.

16 Claims, 16 Drawing Sheets

(56)          References Cited

FOREIGN PATENT DOCUMENTS

| | | | |
|---|---|---|---|
| JP | 2007512516 | A | 5/2007 |
| JP | 2014016205 | A | 1/2014 |
| JP | 2014240788 | A | 12/2014 |
| KR | 10-2007-0113782 | A | 11/2007 |

* cited by examiner (d)　　　　　　　　　　(e)　　　　　　　　　　(f)

FIG. 7

(a) PERSPECTIVE VIEW (b) SIDE VIEW (c) COMPARATIVE EXAMPLE (a) (b) (c)

FIG. 16

PRIOR ART

PROBE PASSING METHOD AND PROBE

This application is a National Stage Application of PCT/JP2022/016456, filed Mar. 31, 2022.

TECHNICAL FIELD

The present invention relates to a probe passing method and a probe, in particular, to a method for inserting a probe through two or more guide plates that constitute a probe card, and an improvement of a probe used in the method.

BACKGROUND ART

A probe card is an inspection device used for testing the electrical characteristics of semiconductor devices formed on a semiconductor wafer. It is equipped with a large number of probes, each making contact with electrode terminals on the semiconductor wafer, provided on a wiring substrate.

A probe card includes a guide unit that supports the probes and a wiring substrate to which the guide unit is attached. The guide unit includes two or more guide plates arranged parallel to each other at a predetermined distance. A probe is sequentially inserted through guide holes of these guide plates and is supported to move up and down. The probe card is manufactured by attaching the guide unit, which houses the probes, to the wiring substrate.

When inserting a probe sequentially through the guide holes of two or more guide plates, it is relatively easy to insert the probe through the guide hole of the first guide plate. However, there is an issue that it is not easy to insert the probe through the guide holes of the second and subsequent guide plates. Particularly, if the probe has a curved portion, there is a problem that it is difficult to insert the probe through two or more guide plates.

Figure 16:
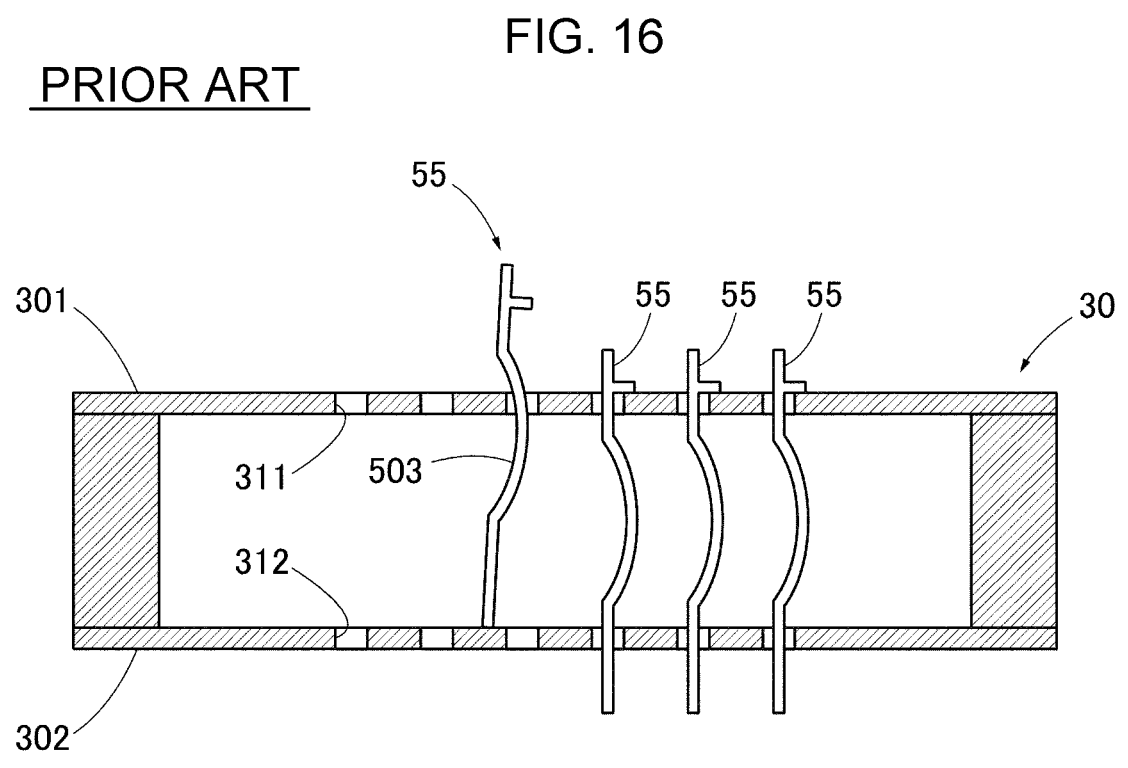

FIG. 16 is a diagram showing how the probe 55 is attached to the guide unit 30. The guide unit 30 includes an upper guide plate 301 and a lower guide plate 302, which are arranged apart from each other. The upper guide plate 301 is provided with upper guide holes 311, and the lower guide plate 302 is provided with lower guide holes 312.

When the probe 55, which is sequentially inserted through the upper guide hole 311 and the lower guide hole 312, has a curved portion 503, the posture of the probe 55 changes as the curved portion 503 passes through the upper guide hole 311, causing a positional shift of the tip of the probe 55. For this reason, it is not easy to insert the tip of the probe 55 through the lower guide hole 312. If forced, it may result in damage or deformation to the probe. This issue arises not only when the probe 55 has a curved portion 503 but also when warping occurs during the manufacturing process of the probe 55.

As a conventional technique, a method has been proposed in which a removable tab is attached to the probe and the tab is gripped using a gripper (for example, Patent Literature 1). However, this does not address the problem caused by the change in the posture of the probe when inserting the probe through two or more guide plates.

CITATION LIST

Patent Literatures

Patent Literature 1: JP 2014-16205 A

SUMMARY OF THE INVENTION

Technical Problem

It is an object of the present invention to facilitate the insertion of a probe through two or more guide plates in view of the above circumstances. In particular, it is an object to provide a method for inserting a probe through two or more guide plates easily. Furthermore, it is an object to provide a probe that can be easily inserted through two or more guide plates.

Solution to the Problem

According to the first embodiment of the present invention, a method for inserting a probe for a probe card in which two guide plates are arranged apart from each other, and the probe is inserted through two guide holes respectively formed in the two guide plates includes inserting a pulling rod through the two guide holes, detachably connecting a tip of the pulling rod inserted through the two guide holes to a connecting portion provided at a tip of the probe, pulling the pulling rod out of the two guide holes, thereby inserting the probe through the two guide holes, and detaching the pulling rod from the probe after pulling it out of the two guide holes.

By adopting such a configuration, the probe is pulled by the pulling rod and moves, being inserted through the two guide holes when the pulling rod is pulled out of the two guide holes. Therefore, by using a pulling rod that is easier to insert through the guide holes than the probe, the insertion of the probe through the guide holes can be facilitated.

The method according to the second embodiment of the present invention, in addition to the above configuration, includes the pulling rod being connected to a connecting surface parallel to an axial direction of the connecting portion. By adopting such a configuration, the probe and the pulling rod can be connected in a manner that prevents easy detachment during pulling.

The method according to the third embodiment of the present invention, in addition to the above configuration, includes a step of removing the connecting portion from the probe after detaching the pulling rod. By adopting such a configuration, it is possible to prevent the shape of the connecting portion from affecting the inspection.

A probe according to the fourth embodiment of the present invention includes an elastically deformable probe body to be inserted through two guide holes respectively formed in two guide plates arranged apart from each other, and a connecting portion protruding in an axial direction from one end of the probe body. Wherein a pulling rod for inserting through the guide plates is detachably connected to a first connecting surface parallel to the axial direction of the connecting portion.

By adopting such a configuration, the probe is connected to a pulling rod inserted through the two guide holes. By pulling the pulling rod out of the two guide holes, the probe is pulled and moved by the pulling rod, and inserted through the two guide holes. Therefore, by using a pulling rod that is easier to insert through the guide holes than the probe, the insertion of the probe through the guide holes can be facilitated.

A probe according to the fifth embodiment of the present invention, in addition to the above configuration, the first connecting surface is provided at a position recessed from a side surface of the probe body, and a second connecting surface of the pulling rod connected to the first connecting surface is positionable closer to the first connecting surface than the side surface of the probe body.

By adopting such a configuration, the total thickness of the connected probe and pulling rod, with the first connecting surface and the second connecting surface facing each other, can be reduced, thereby facilitating the insertion of the probe through the two guide holes.

A probe according to the sixth embodiment of the present invention, in addition to the above configuration, solder or thermoplastic adhesive is formed on the first connecting surface or the second connecting surface. By adopting such a configuration, the probe and the pulling rod can be connected or separated by heating the probe or the pulling rod.

A probe according to the seventh embodiment of the present invention, in addition to the above configuration, an engaging portion to be engaged with the pulling rod is provided on the first connecting surface. By adopting such a configuration, the first connecting surface and the second connecting surface can be connected.

A probe according to the eighth embodiment of the present invention, in addition to the above configuration, the engaging portion is a hook shape formed to protrude from the first connecting surface, with a tip facing the probe body. By adopting such a configuration, the connection can be made in a manner that prevents easy detachment during pulling.

A probe according to the ninth embodiment of the present invention, in addition to the above configuration, the engaging portion includes an engaging hole formed in the first connecting surface. By adopting such a configuration, the connection can be made in a manner that prevents easy detachment during pulling.

A probe according to the tenth embodiment of the present invention, in addition to the above configuration, the connecting portion has a tapered shape with a cross-sectional area decreasing towards a tip opposite the probe body. By adopting such a configuration, the probe can be easily inserted through the guide holes. Additionally, if the probe is used for inspection without removing the connecting portion, the sharpened tip can be utilized.

Advantages of the Invention

According to the present invention, it is possible to facilitate the insertion of a probe through two or more guide plates. In particular, a method for inserting a probe easily through two or more guide plates is provided. Moreover, a probe that can be easily inserted through two or more guide plates is provided.

BRIEF DESCRIPTION OF DRAWINGS

FIG. 7 is a diagram showing in detail the state after the probe 50 and the pulling rod 60 are connected.

FIG. 16 is a diagram showing how the conventional probe 55 is attached to the guide unit 30.

DETAILED DESCRIPTION OF THE INVENTION

In this specification, the axial direction of the probe refers to the longitudinal direction of the probe, the width direction of the probe refers to any one direction perpendicular to the axial direction, and the thickness direction of the probe refers to the direction perpendicular to both the axial direction and the width direction.

First Embodiment

Figure 1:
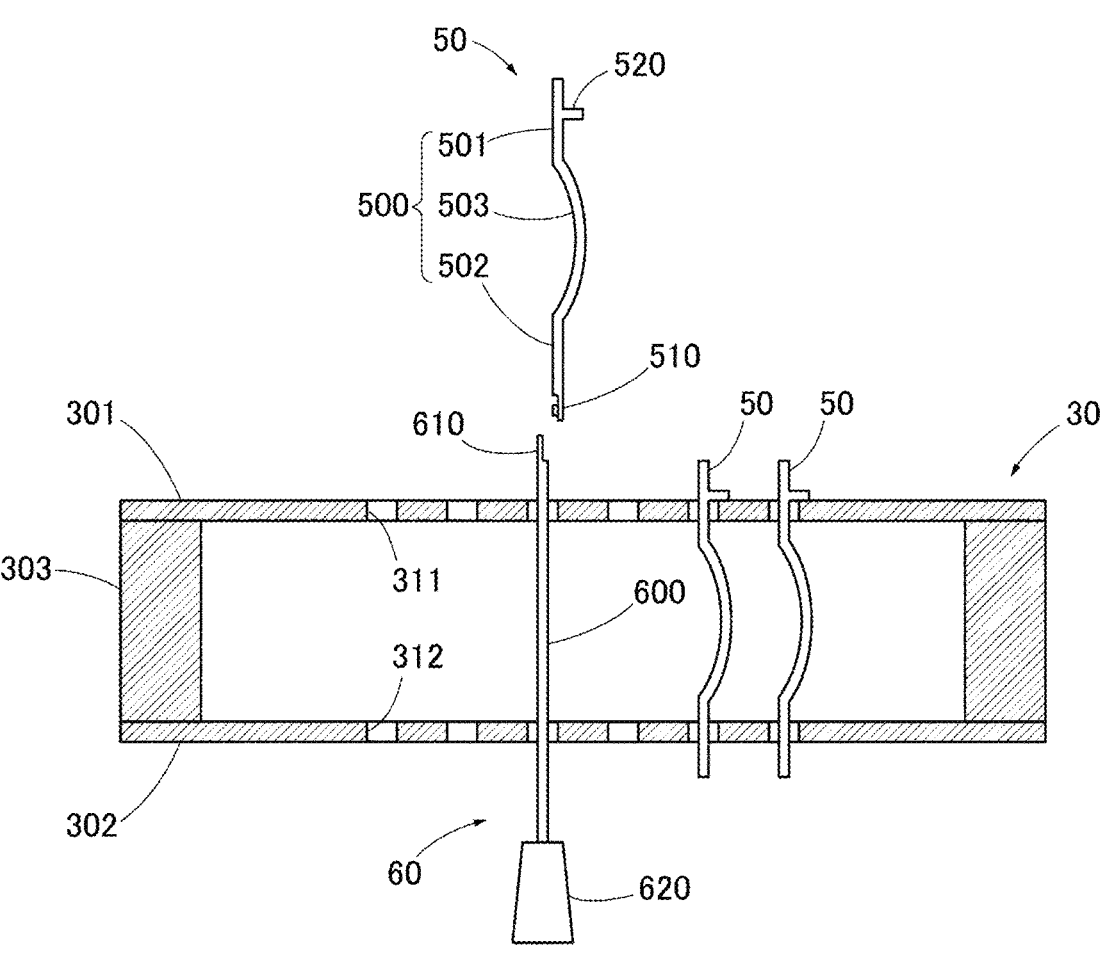
FIG. 1 is a diagram showing an overview of a method for inserting a probe according to the first embodiment of the present invention.

FIG. 1 is a diagram showing an overview of a method for inserting a probe according to the first embodiment of the present invention, illustrating an example of how a probe 50 is attached to a guide unit 30 using a pulling rod 60.

The pulling rod 60 is a jig for inserting the probe 50 through guide holes 311 and 312 of a guide unit 30. The pulling rod 60 is first inserted through the guide holes 311 and 312 ahead of the probe 50. After that, by pulling the pulling rod 60 connected to the probe 50 out of the guide holes 311 and 312, the probe 50 is drawn by the pulling rod 60 and inserted through the guide holes 311 and 312. Subsequently, by detaching the pulling rod 60 from the probe 50, the probe 50 is attached to the guide unit 30.

(1) Guide Unit 30

The guide unit 30 includes two guide plates 301 and 302 that support the probe 50, and a connecting spacer 303 that connects these guide plates 301 and 302 to each other.

The upper guide plate 301 is a plate-like member, such as a ceramic plate, in which two or more upper guide holes 311 are formed. The upper guide holes 311 are holes that penetrate through the upper guide plate 301 in the thickness direction, through which the probe 50 is inserted, and they support the vicinity of the upper end of the probe 50.

The lower guide plate 302 is a plate-like member, such as a ceramic plate, in which two or more lower guide holes 312 are formed. It is arranged to face the lower surface of the upper guide plate 301 via the connecting spacer 303. The lower guide plate 302 is positioned below the upper guide plate 301, parallel to the upper guide plate 301 at a predetermined distance. The lower guide holes 312 are holes that penetrate through the lower guide plate 302 in the thickness direction, through which the probe 50 is inserted, and they support the vicinity of the lower end of the probe 50 in a manner that allows it to move up and down.

The upper guide hole 311 and the lower guide hole 312, through which the same probe 50 is inserted, are preferably arranged to face each other in a direction perpendicular to the guide plates 301 and 302, making it easier for the pulling rod 60 to be inserted. However, the present invention is not limited to such a configuration.

(2) Probe 50

The probe 50 is a vertical-type probe that extends in a direction substantially perpendicular to the guide plates 301 and 302. The probe 50 is made of a conductive material with an elongated shape, formed by methods such as plating. Metal materials with both good elastic and conductive properties, such as nickel (Ni) alloys or palladium (Pd) alloys, are used for the probe 50. The probe 50 may be made of a single conductive material, but it can also be made of two or more conductive materials. For example, materials with particularly high conductive properties, such as gold (Au) or copper (Cu), can be used in part.

The probe 50 includes a probe body 500, a first connecting portion 510, and a stopper 520. The probe body 500 includes an upper rod 501, a lower rod 502, and a curved portion 503. The upper rod 501 and the lower rod 502 are connected via the curved portion 503. The first connecting portion 510 is provided on the lower rod 502, and the stopper 520 is provided on the upper rod 501.

The upper rod 501 has a substantially straight shape, is inserted through the upper guide hole 311, and is supported by the upper guide plate 301. The upper end of the upper rod 501 protrudes upward from the guide unit 30, and the lower end of the upper rod 501 is connected to the curved portion 503 within the guide unit 30.

The lower rod 502 has a substantially straight shape, is inserted through the lower guide hole 312, and is supported by the lower guide plate 302. The lower end of the lower rod 502 protrudes downward from the guide unit 30, and the upper end of the lower rod 502 is connected to the curved portion 503 within the guide unit 30. Although the lower rod 502 is shown as being coaxial with the upper rod 501 in the figure, the present invention is not limited to such a configuration.

The curved portion 503 has a curved shape and elastically deforms under the pressure exerted by the object under test during inspection. The curved portion 503 buckles under the external force received from the object under test, allowing the probe 50 to elastically contact the object under test. By providing the curved portion 503, it is possible to predetermine the part and direction of the probe 50 that will deform, thereby suppressing contact between adjacent probes 50.

The first connecting portion 510 is a connecting member for detachably connecting the pulling rod 60. The first connecting portion 510 is formed as a protruding part that protrudes in the axial direction, that is, in a substantially vertical direction from the tip of the lower rod 502 from the lower end of the probe body 500. The pulling rod 60 is connected to face the side surface of the first connecting portion 510.

The stopper 520 is a protruding part provided on the side surface of the upper rod 501. By engaging the stopper 520 with the upper surface of the upper guide plate 301, the probe 50 is prevented from falling out of the guide unit 30.

(3) Pulling Rod 60

The pulling rod 60 is a jig that, after being inserted through the guide holes 311 and 312 ahead of the probe 50, pulls the probe 50 and inserts it through the guide holes 311 and 312. The pulling rod 60 may be made of the same material as the probe 50 or a different material. The pulling rod 60 includes a rod body 600, a second connecting portion 610, and a handle 620.

The rod body 600 has a substantially straight shape, with the second connecting portion 610 provided at its upper end and the handle 620 provided at its lower end.

The second connecting portion 610 is a connecting member that detachably connects to the probe 50. The second connecting portion 610 is formed to protrude in the axial direction from the upper end of the rod body 600, and the probe 50 is connected to face the side surface of the second connecting portion 610.

The handle 620 is a gripping part held by an operator or an assembly robot. The handle 620 has a larger cross-sectional area than the rod body 600, making it easy to grip.

(4) Method for Inserting Probe

Figure 2:
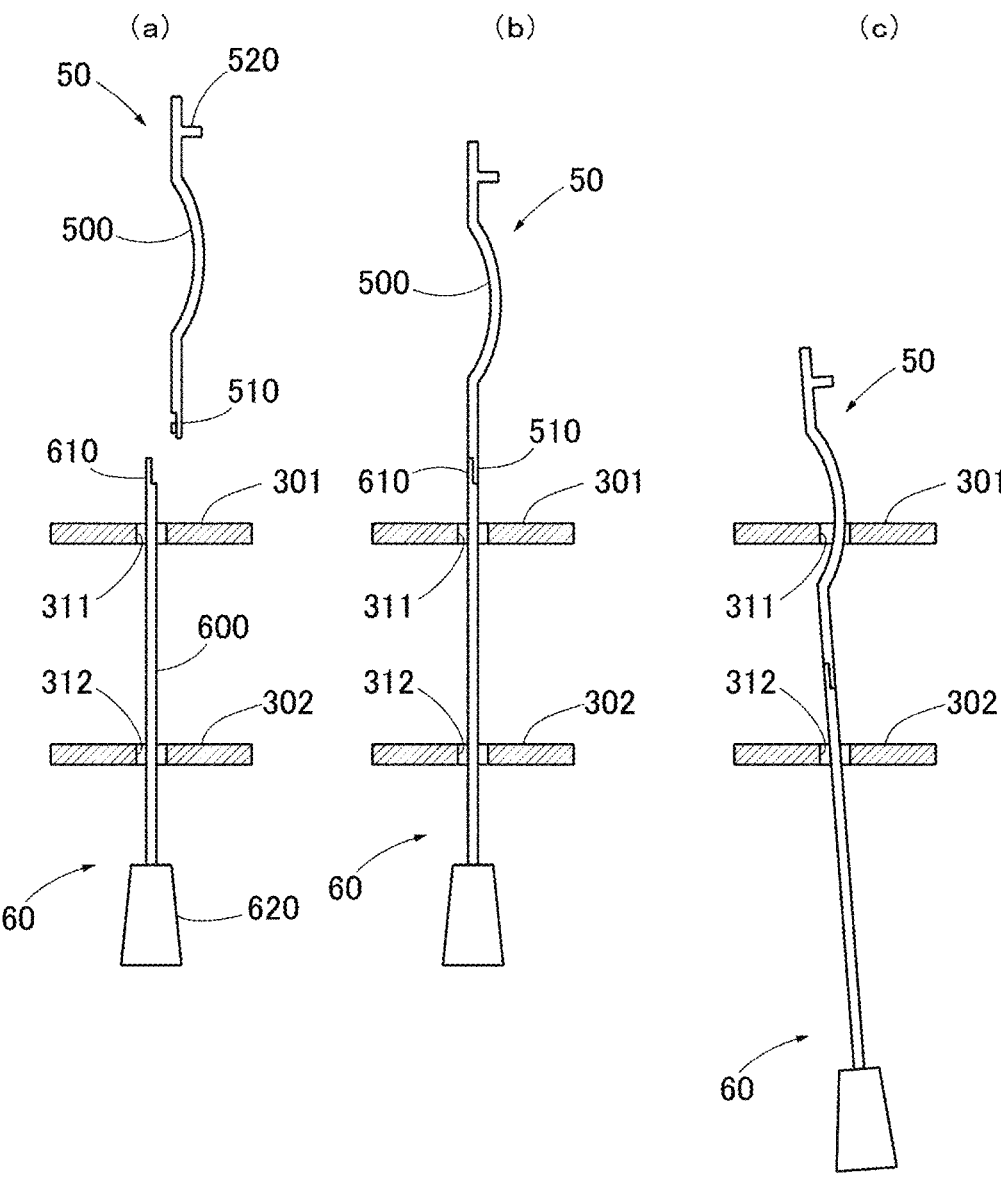
FIG. 2 is a diagram showing an example of the detailed procedure of a method for inserting the probe 50.
Figure 3:
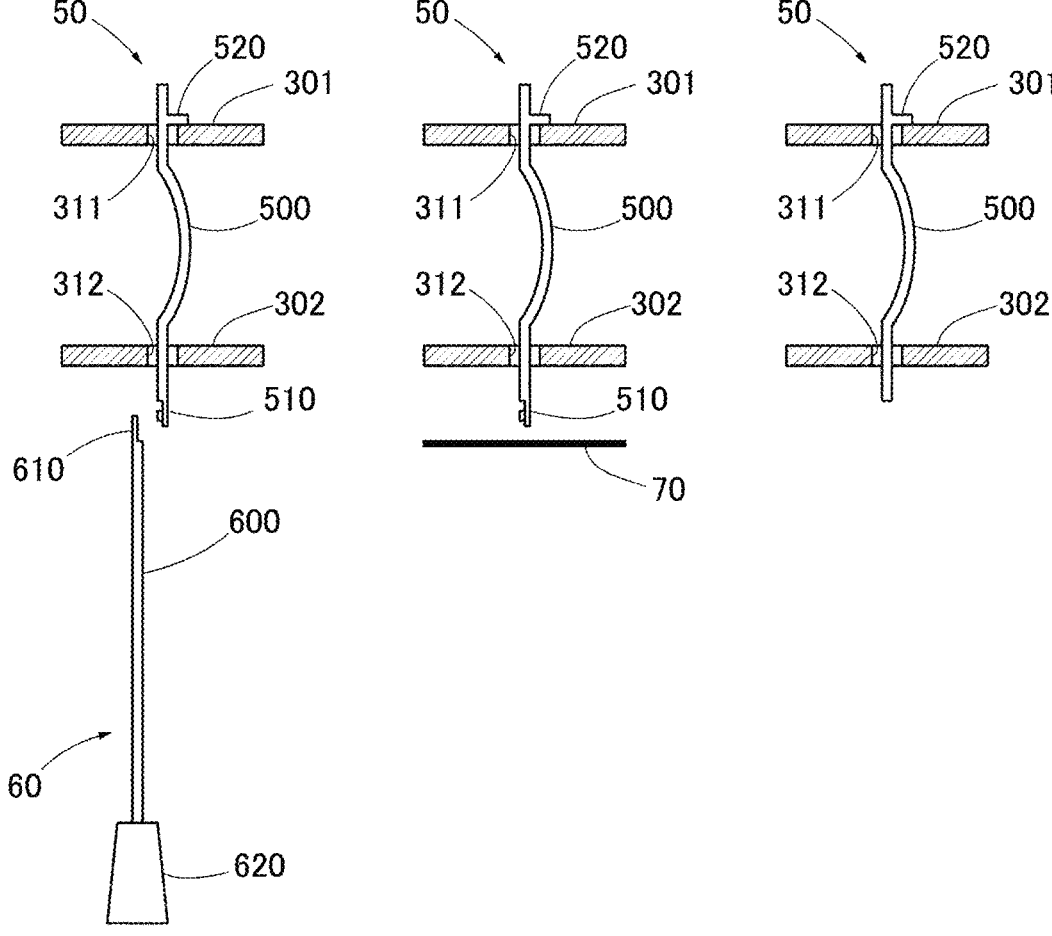
FIG. 3 is a diagram showing an example of the detailed procedure of a method for inserting the probe 50.

FIGS. 2 and 3 are diagrams showing an example of the detailed procedure of a method for inserting the probe 50, illustrating the steps (a) to (f) in chronological order of attaching the probe 50 to the guide unit 30 using the pulling rod 60. The probe attachment process shown in the figures is part of the manufacturing process of the probe card and is also part of the repair process for replacing damaged probes 50 in the probe card.

Step (a) in the figure shows the same state as in FIG. 1, focusing on the probe 50 and the pulling rod 60. It shows the state after the pulling rod 60 has been inserted through the lower guide hole 312 and further through the upper guide hole 311. The pulling rod 60 is inserted through the guide holes 312 and 311 from the bottom. Since the pulling rod 60 has a substantially straight shape, it can be more easily inserted through the guide holes 311 and 312 compared to the probe 50, which has a curved portion 503.

Step (b) in the figure shows the state where the second connecting portion 610 of the pulling rod 60 protrudes above the upper guide plate 301, and the probe 50 is connected to the pulling rod 60. The first connecting portion 510 of the probe 50 and the second connecting portion 610 of the pulling rod 60 are detachably connected.

Step (c) in the figure shows the pulling rod 60 being withdrawn from the guide holes 311 and 312. When the pulling rod 60 is moved downward, the probe 50 is also pulled downward by the pulling rod 60. As a result, the probe 50 is inserted through the upper guide hole 311 and further through the lower guide hole 312.

Step (d) in the figure shows the state after the pulling rod 60 has been detached. When the pulling rod 60 is moved downward, after it is completely withdrawn from the guide holes 311 and 312, the stopper 520 of the probe 50 engages with the upper surface of the upper guide plate 301, stopping the movement of the pulling rod 60. At this point, the first connecting portion 510 and the second connecting portion 610 are positioned below the lower guide plate 302, having passed through the lower guide hole 312. Therefore, when the pulling rod 60 is detached from the probe 50, the probe 50 remains inserted through the guide holes 311 and 312.

Step (e) in the figure shows the process of removing the first connecting portion 510 from the probe 50. The first connecting portion 510 is removed as needed. For example, the first connecting portion 510 can be removed by rubbing the lower end of the probe 50 with a cleaning sheet 70 that has an abrasive layer.

Step (f) in the figure shows the state after the removal of the first connecting portion 510. The probe 50 without the first connecting portion 510 is in a state of being inserted through the guide holes 311 and 312. In this embodiment, the example where the first connecting portion 510 is removed is described, but it is also possible to omit the polishing step of step (e) and leave the first connecting portion 510 intact, allowing the tip of the first connecting portion 510 to contact the object under test.

(5) Probe Card 1

Figure 4:
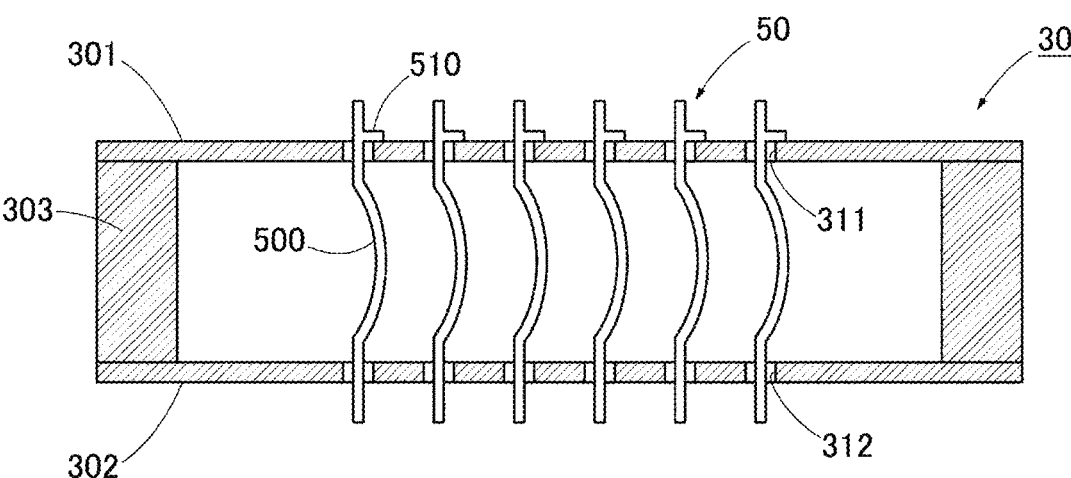
FIG. 4 is a diagram showing the guide unit 30 with the probe 50 attached.
Figure 5:
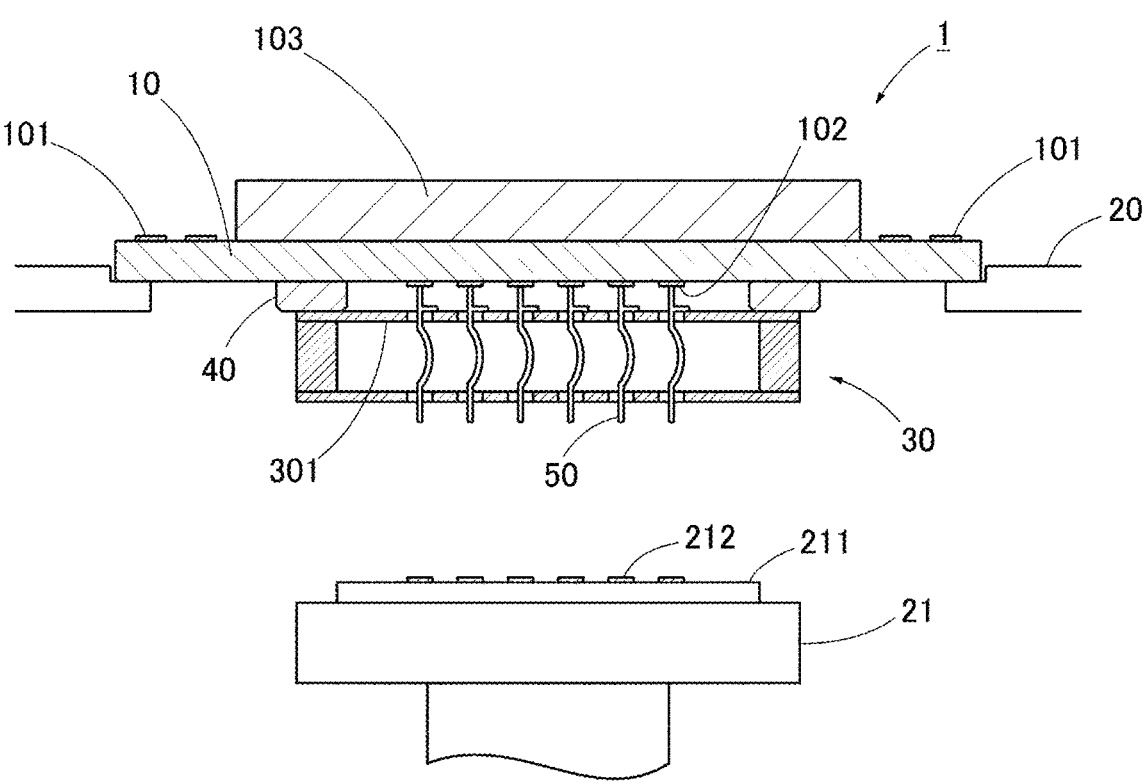
FIG. 5 is a diagram showing the probe card 1 with the guide unit 30 attached as shown in FIG. 4.

FIG. 4 is a diagram showing the guide unit 30 with all necessary probes 50 attached. FIG. 5 is a diagram showing the probe card 1 with the guide unit 30 of FIG. 4 attached. The cross-section shown is of the probe card 1 horizontally arranged in a wafer prober, cut along a vertical plane.

The probe card 1 is attached to a card holder 20 in such a manner that the installation surface of the probes 50 faces the semiconductor wafer 211 on the stage 21. By moving the stage 21 up and down, the probes 50 can be brought into contact with the electrode terminals 212 on the semiconductor wafer 211. The probe card 1 includes a main substrate 10, a reinforcing plate 103, a guide unit 30, and two or more probes 50.

The main substrate 10 is a wiring substrate that can be detachably attached to a wafer prober. The outer peripheral edge of its lower surface is supported by the card holder 20 of the wafer prober and is arranged horizontally. A reinforcing plate 103 is attached to the central part of the upper surface of the main substrate 10, and two or more external terminals 101 to which signal terminals of a tester device (not shown) are connected are provided on the outer peripheral edge. Two or more probe electrodes 102 for connecting the probes 50 are provided in the central part of the lower surface. The probe electrodes 102 and the external terminals 101 are electrically connected to each other through the main substrate 10.

The guide unit 30 is a supporting member that supports two or more probes 50 in a manner that allows vertical movement and positions them within the horizontal plane. It is attached to face the lower surface of the main substrate 10 via a mounting spacer 40. In other words, the upper guide plate 301 is positioned below the main substrate 10, parallel to it, at a predetermined distance.

The probe 50 has a shape that extends in a direction intersecting the main substrate 10, with both its upper and lower ends protruding from the guide unit 30. The upper end of the probe 50 is connected to the probe electrode 102, and the lower end of the probe 50 can be brought into contact with the electrode terminal 212 on the object under test.

(6) Connecting Portions 510, 610

Figure 6:
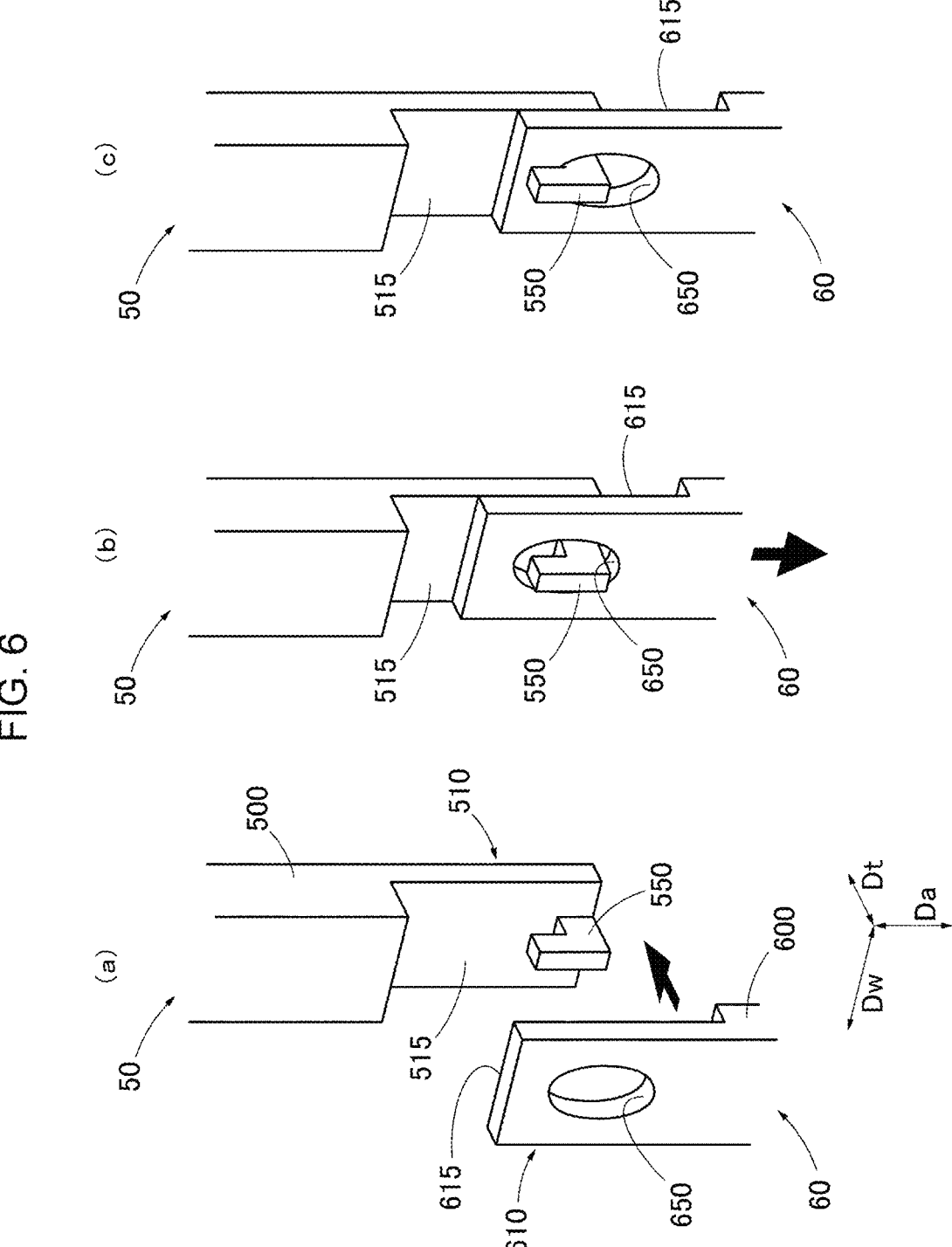
FIG. 6 is a diagram showing an example of the detailed configuration of the connecting portions 510 and 610 of FIG. 1.

FIG. 6 is a diagram showing an example of the detailed configuration of the connecting portions 510 and 610 of FIG. 1. Parts (a) to (c) in the figure chronologically illustrate the process of connecting the probe 50 and the pulling rod 60. The illustrated Da, Dt, and Dw indicate the axial direction, thickness direction, and width direction of the probe 50, respectively. The axial direction Da is vertical, while the thickness direction Dt and the width direction Dw are horizontal and orthogonal to each other.

The first connecting portion 510 is provided at the tip of the probe body 500 and has a first connecting surface 515. The first connecting surface 515 is a side surface of the first connecting portion 510 and is formed, for example, as a plane parallel to the axial direction Da. An engaging protrusion 550 is provided on the first connecting surface 515. The engaging protrusion 550 is an engaging member that detachably engages with the pulling rod 60 and is formed, for example, as a hook-shaped protrusion that protrudes from the first connecting surface 515 in the thickness direction Dt with its tip facing the probe body 500.

The second connecting portion 610 is provided at the tip of the rod body 600 and has a second connecting surface 615. The second connecting surface 615 is a side surface of the second connecting portion 610 and is, for example, a plane parallel to the axial direction Da. An engaging hole 650 is formed on the second connecting surface 615. The engaging hole 650 is an engaging member that detachably engages with the engaging protrusion 550 and is formed, for example, as a through-hole on the second connecting surface 615 that penetrates the second connecting portion 610 in the thickness direction Dt.

The connection between the probe 50 and the pulling rod 60 is made by aligning the first connecting surface 515 with the second connecting surface 615 and engaging the engaging protrusion 550 on the first connecting surface 515 with the engaging hole 650 on the second connecting surface 615. By connecting the side surfaces of the probe 50 and the pulling rod 60, it is possible to ensure that they do not easily detach during pulling. The engaging protrusion 550 is hook-shaped with its tip facing away from the pulling rod 60, which helps prevent easy detachment during pulling.

In part (a) of the figure, the state before the connection is shown. The probe 50 and the pulling rod 60 are arranged such that the first connecting surface 515 and the second connecting surface 615 face each other, spaced apart.

In part (b) of the figure, the state during the connection is shown. By moving the probe 50 or the pulling rod 60 shown in part (a) horizontally so that the second connecting surface 615 approaches and contacts the first connecting surface 515, the engaging protrusion 550 is inserted into the engaging hole 650.

In part (c) of the figure, the state after the connection is shown. By moving the probe 50 or the pulling rod 60 shown in part (b) vertically to separate them, the hook-shaped engaging protrusion 550 engages with the engaging hole 650. When the engaging protrusion 550 and the engaging hole 650 engage, the probe 50 is connected to the pulling rod 60, allowing the probe 50 to be pulled by the pulling rod 60.

The detachment of the pulling rod 60 from the probe 50 is carried out in the reverse order of steps (a) to (c). In other words, by moving the probe 50 or the pulling rod 60 shown in part (c) vertically to bring them closer together, the engagement between the engaging protrusion 550 and the engaging hole 650 is released, returning to the state shown in part (b). Then, by moving the probe 50 or the pulling rod 60 horizontally to separate them, the engaging protrusion 550 is withdrawn from the engaging hole 650, returning to the state shown in part (a), and the pulling rod 60 is detached from the probe 50.

Figure 7:
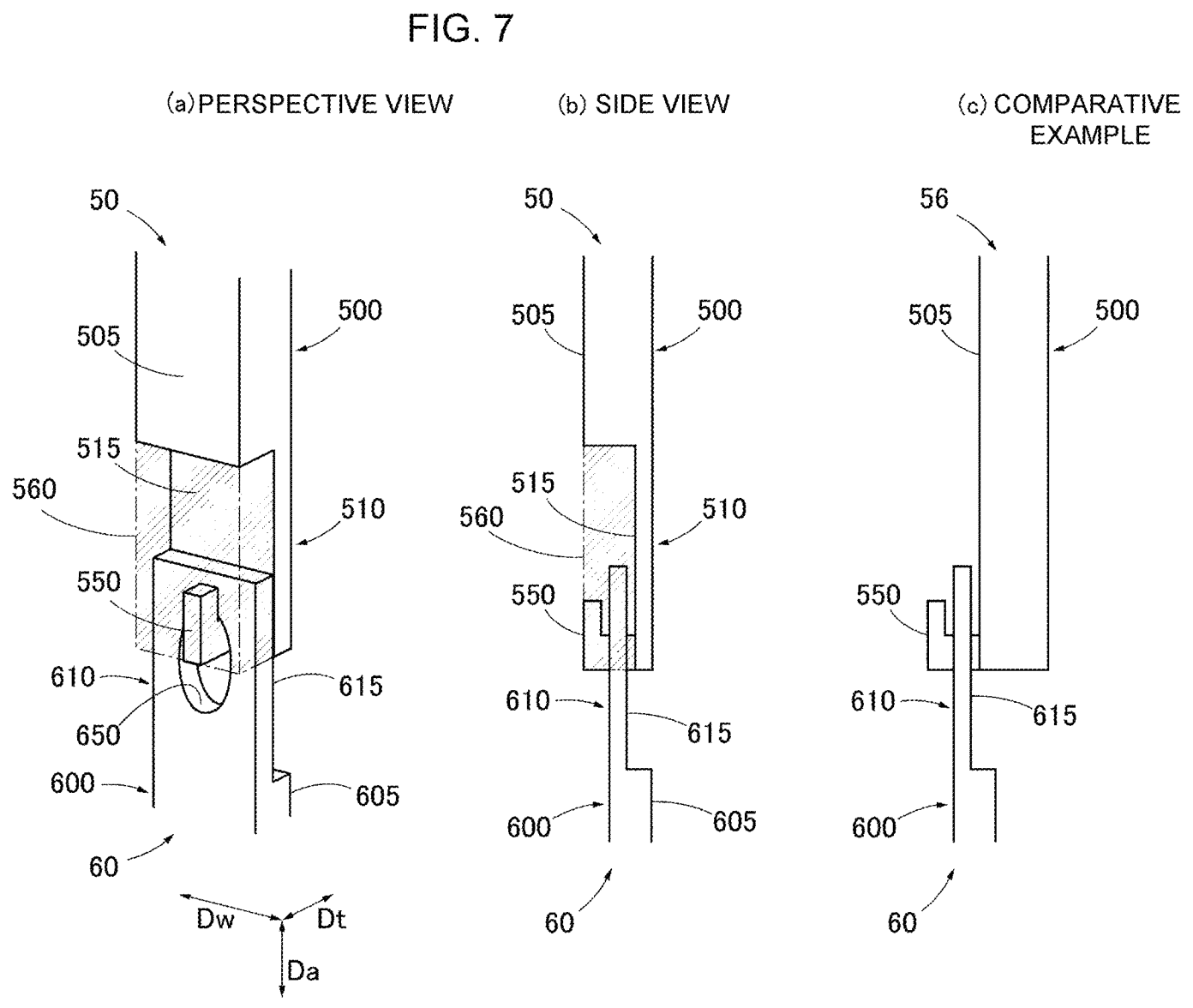

FIG. 7 is a diagram showing in detail the state after the probe 50 and the pulling rod 60 are connected. Part (a) in the figure shows a perspective view, and part (b) shows a side view. Part (c) in the figure shows a side view of the probe 56 as a comparative example.

As shown in parts (a) and (b) of the figure, the thickness of the first connecting portion 510 is thinner than that of the probe body 500, and the first connecting surface 515 is formed as a recessed surface compared to the side surface 505 of the probe body 500. Therefore, a connecting space 560 is formed within the outline of the cross-section of the probe body 500 when viewed from the axial direction. In other words, the connecting space 560 is an area adjacent to the first connecting surface 515 and formed inside the side surface 505. By positioning the second connecting surface 615 within this connecting space 560, the total thickness of the connected first connecting portion 510 and the second connecting portion 610 can be minimized. Thus, it becomes easier to insert the probe 50 through the guide holes 311 and 312.

Similarly, the thickness of the second connecting portion 610 is thinner than that of the rod body 600, and the second connecting surface 615 is formed as a recessed surface compared to the side surface 605 of the rod body 600. This allows the first connecting surface 515 to be positioned inside the side surface 605, minimizing the total thickness of the connected first connecting portion 510 and second connecting portion 610. Thus, it becomes easier to insert the probe 50 through the guide holes 311 and 312.

The width of the first connecting portion 510 is equal to or less than the width of the probe body 500, and the first connecting portion 510 is positioned within the outline of the cross-section of the probe body 500 when viewed from the axial direction. Therefore, the first connecting portion 510 does not obstruct the insertion of the probe 50 through the guide holes 311 and 312.

In part (c) of the figure, a probe 56 is shown as a comparative example, where the engaging protrusion 550 is formed on the side surface 505 of the probe body 500. The probe 56 does not have the first connecting portion 510, and therefore, does not have the connecting space 560. As a result, the total thickness of the connected probe 56 and the second connecting portion 610 becomes excessive, making the insertion of the probe 56 through the guide holes 311 and 312 more difficult compared to the probe 50 shown in parts (a) and (b).

In parts (a) and (b) of FIG. 7, an example is shown where the second connecting portion 610 is completely housed within the connecting space 560 when viewed from the axial direction, without protruding beyond the outline of the cross-section of the probe body 500. However, the present invention is not limited to such cases. It is also acceptable if a part of the second connecting portion 610 protrudes outside the connecting space 560 when viewed from the axial direction.

Figure 8:
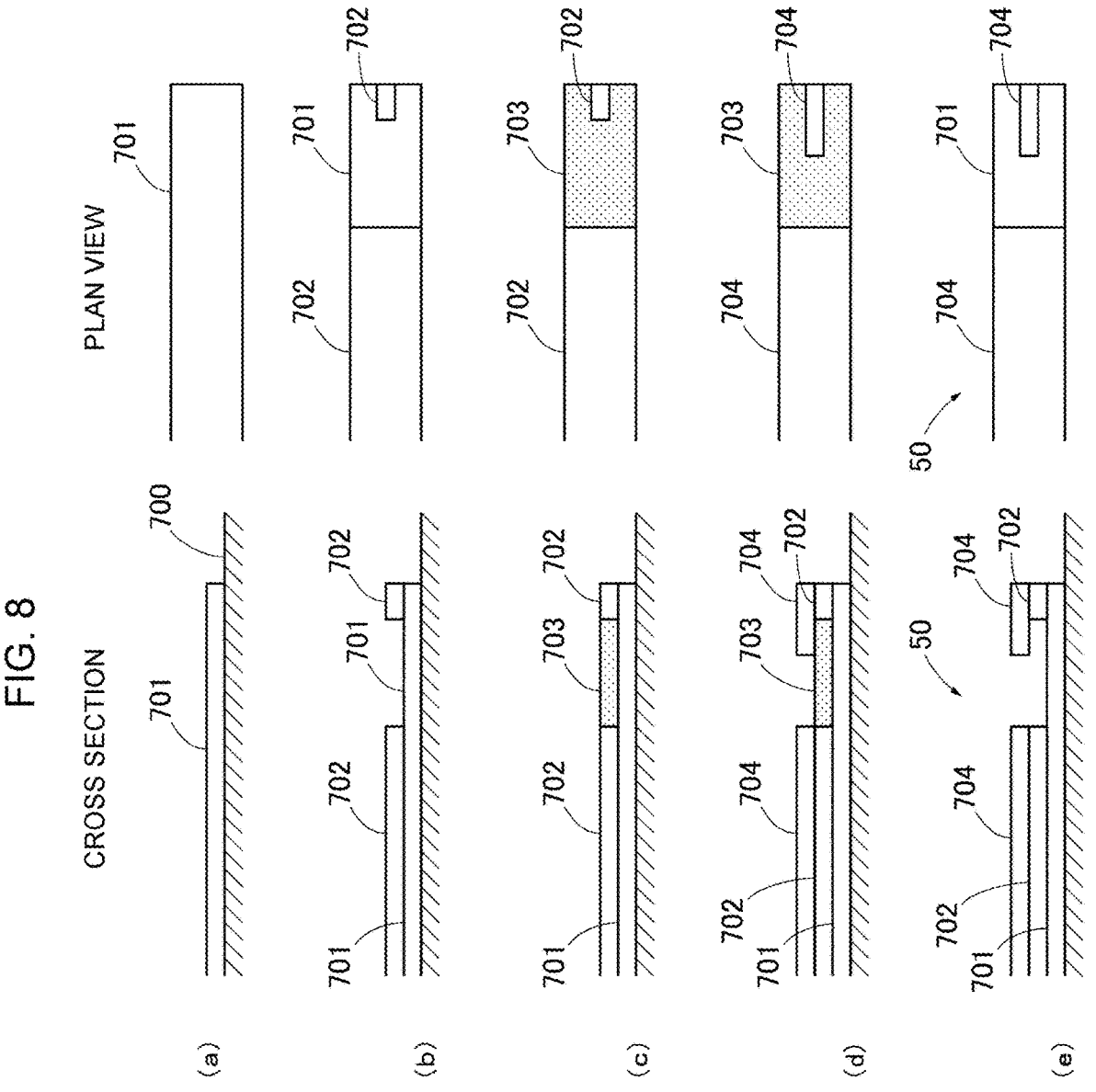
FIG. 8 is a diagram showing an example of a method for manufacturing the probe 50.

FIG. 8 is a diagram showing an example of a method for manufacturing the probe 50, with the main steps (a) to (e) of the manufacturing process shown in chronological order. The probe 50 is manufactured using an electroplating method.

First, a conductive layer 701 is formed on a substrate 700 for probe formation using electroplating (step (a)). The conductive layer 701 is patterned as a series of regions corresponding to the probe body 500 and the first connecting portion 510. Patterning is achieved through an exposure and development process using a photoresist.

Next, a conductive layer 702 is formed on a part of the conductive layer 701 using electroplating (step (b)). The conductive layer 702 is patterned as two separate regions corresponding to the probe body 500 and the engaging protrusion 550.

Next, a sacrificial layer 703 is formed on the conductive layer 701 where the conductive layer 702 is not present, using electroplating, and the surface is flattened through polishing (step (c)). A sacrificial layer is formed during the process of creating three-dimensional structures by electroplating and is removed later through etching. The sacrificial layer 703 is made of a different material than the conductive layers 701, 702, and 704, such as copper (Cu).

Next, a conductive layer 704 is formed by electroplating on the exposed areas of the conductive layer 702 and on part of the sacrificial layer 703 (step (d)). The conductive layer 704 is patterned as two separate regions corresponding to the probe body 500 and the engaging protrusion 550. The region corresponding to the engaging protrusion 550 is formed across both the conductive layer 702 and the sacrificial layer 703.

Finally, by etching and removing the sacrificial layer 703, the conductive layer 704 formed on the sacrificial layer 703 becomes the tip of the engaging protrusion 550, thereby forming the probe 50.

Figure 9:
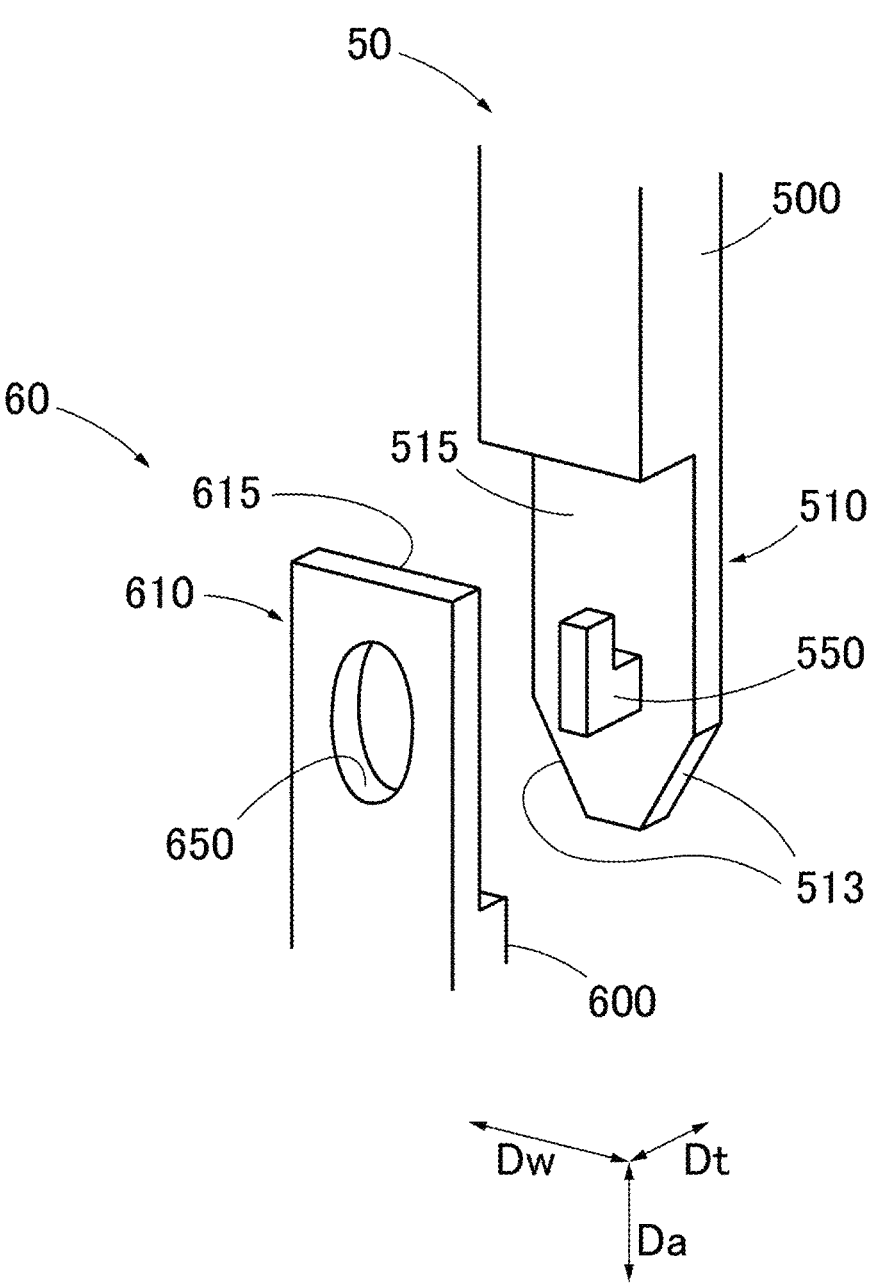
FIG. 9 is a diagram showing another configuration example of the probe 50.

FIG. 9 is a diagram showing another configuration example of the probe 50. This probe 50 differs from the probe 50 in FIG. 6 in that the first connecting portion 510 has a tapered shape, with its cross-sectional area decreasing towards the tip.

The thickness of the first connecting portion 510 is constant, and a tapered surface 513 intersects with the first connecting surface 515, inclining with respect to the axial direction Da. The width of the first connecting portion 510 narrows towards the tip. As a result, the cross-sectional area decreases towards the tip.

By tapering the tip of the first connecting surface 515, the insertion of the probe 50 through the guide holes 311 and 312 can be facilitated.

Figure 10:
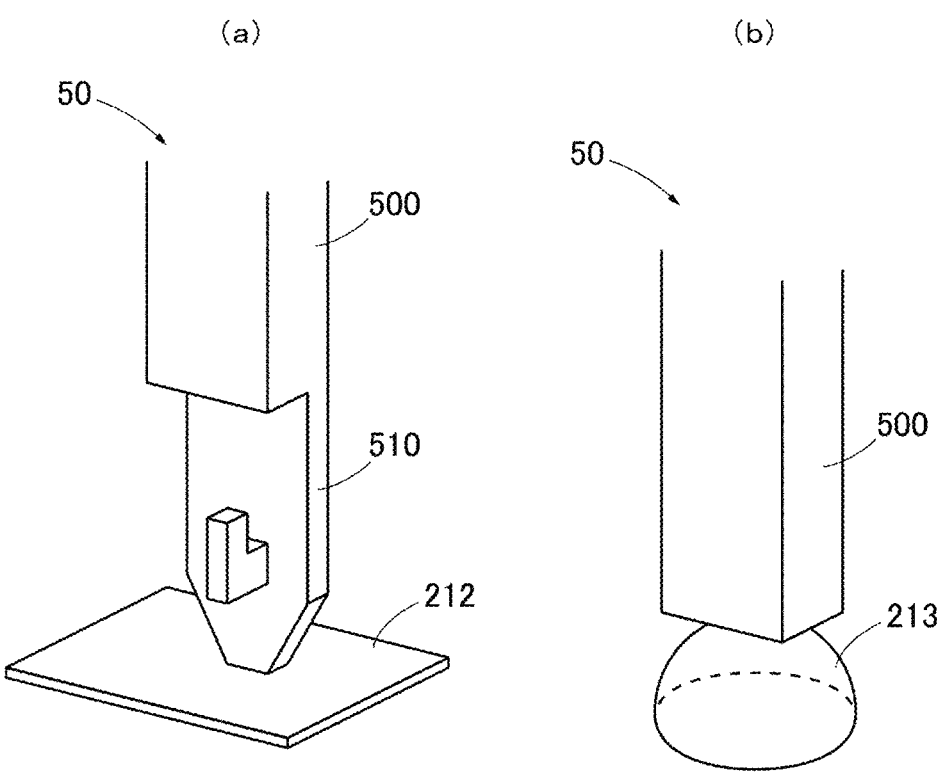
FIG. 10 is a diagram showing the state during inspection using the probe 50 of FIG. 9.

FIG. 10 is a diagram showing the state during inspection using the probe of FIG. 9. In part (a) of the figure, the process of conducting an inspection using the probe 50 with the first connecting portion 510 is shown. When inspecting by bringing the probe 50 into contact with the electrode terminals 212 on a semiconductor wafer, it is desirable to perform a scrubbing action during contact to remove the oxide film on the electrode terminals 212. This is more effectively achieved with a pointed tip on the probe 50. Therefore, in such cases, it is preferable to conduct the inspection using the probe 50 with the tapered first connecting portion 510 intact, without removing it.

In part (b) of the figure, the process of conducting an inspection using the probe 50 with the first connecting portion 510 removed is shown. When the first connecting portion 510 is removed using a cleaning sheet 70, a flat cross-section appears at the tip of the probe body 500. When inspecting by bringing the probe 50 into contact with the bump electrodes 213 on a semiconductor wafer, a flat tip is advantageous for stable contact and for reducing the indentation marks on the bump electrodes 213 caused by contact. Therefore, in such cases, it is preferable to conduct the inspection using the probe 50 with the first connecting portion 510 removed.

Second Embodiment

In the first embodiment, an example of a probe insertion method is described in which the probe 50 with an engaging protrusion 550 is connected to the pulling rod 60 with an engaging hole 650. In the second embodiment, a probe insertion method will be described in which a probe 51 with an engaging hole 551 is connected to a pulling rod 61 with an engaging protrusion 651.

Figure 11:
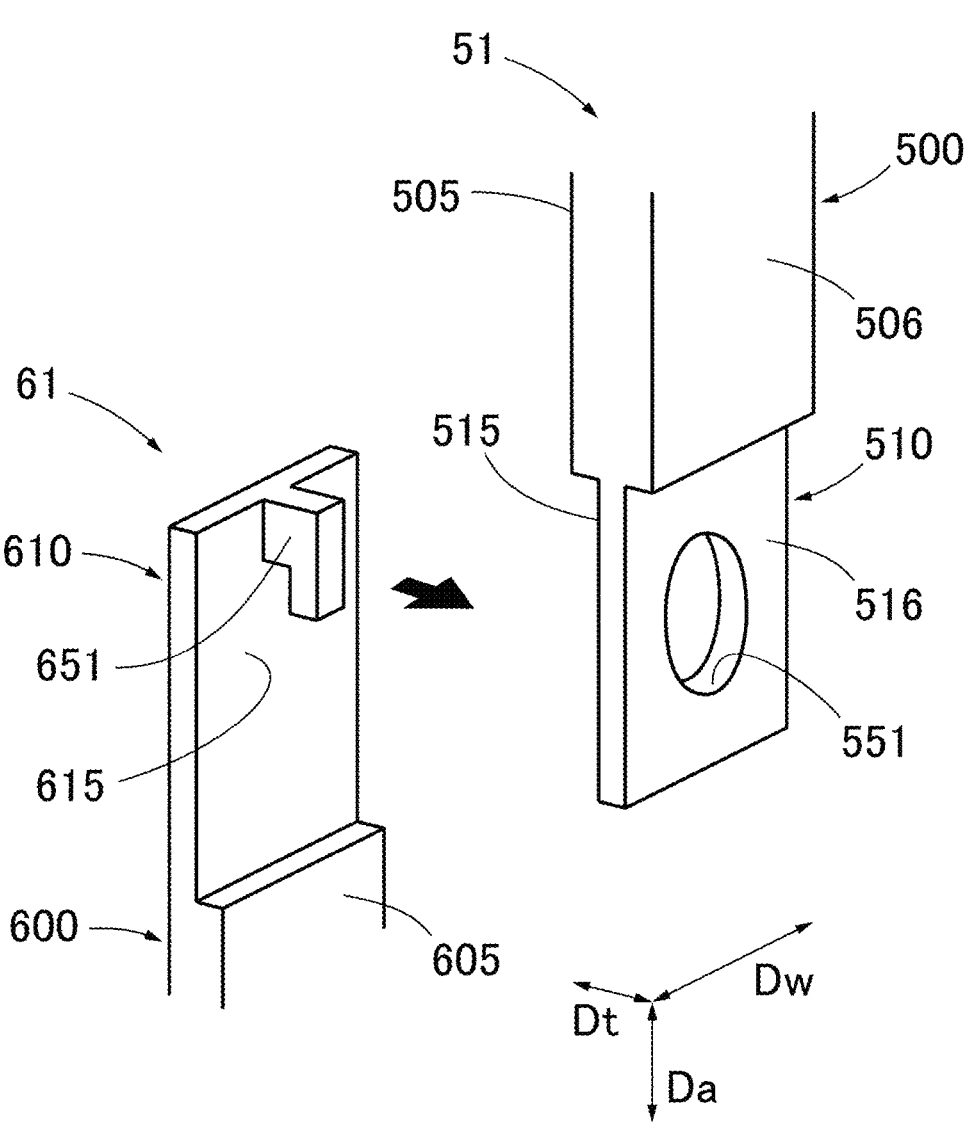
FIG. 11 is a diagram showing an example of a method for inserting a probe according to the second embodiment of the present invention.

FIG. 11 is a diagram showing an example of a method for inserting a probe according to the second embodiment of the present invention, illustrating an example of the detailed configuration of the first connecting portion 510 of the probe 51 and the second connecting portion 610 of the pulling rod 61. Compared to the probe 50 and the pulling rod 60 of the first embodiment in FIG. 6, the configuration of the first connecting portion 510 and the second connecting portion 610 differs for the probe 51 and the pulling rod 61. Other configurations are the same as those of the probe 50 and the pulling rod 60, so redundant explanations are omitted.

The first connecting portion 510 is provided at the tip of the probe body 500 and has a first connecting surface 515 and a connecting back surface 516. The first connecting surface 515 is a side surface of the first connecting portion 510 and is formed, for example, as a plane parallel to the axial direction Da. The connecting back surface 516 is the side surface of the first connecting portion 510 that faces the first connecting surface 515. An engaging hole 551 is provided on the first connecting surface 515. The engaging hole 551 is an engaging member that detachably engages with the pulling rod 61 and is formed, for example, as a through-hole on the first connecting surface 515 that penetrates the first connecting portion 510 in the thickness direction Dt.

The second connecting portion 610 is provided at the tip of the rod body 600 and has a second connecting surface 615. The second connecting surface 615 is a side surface of the second connecting portion 610 and is, for example, a plane parallel to the axial direction Da. An engaging protrusion 651 is provided on the second connecting surface 615. The engaging protrusion 651 is an engaging member that detachably engages with the engaging hole 551 and is formed, for example, as a hook-shaped protrusion that protrudes from the second connecting surface 615 in the thickness direction Dt with its tip facing the rod body 600.

The connection between the probe 51 and the pulling rod 61 is made by aligning the first connecting surface 515 with the second connecting surface 615 and engaging the engaging hole 551 with the engaging protrusion 651. By connecting the side surfaces of the probe 51 and the pulling rod 61, it ensures that they do not easily detach during pulling. Since the engaging protrusion 651 is hook-shaped with its tip facing away from the probe 51, it helps prevent easy detachment during pulling.

The thickness of the first connecting portion 510 is thinner than that of the probe body 500, and the first connecting surface 515 and the connecting back surface 516 are each formed as recessed surfaces compared to the corresponding side surfaces 505 and 506 of the probe body 500. This allows the second connecting surface 615 to be positioned inside the side surface 505, thereby minimizing the total thickness of the connected first connecting portion 510 and the second connecting portion 610. At least a part of the engaging protrusion 651 protruding from the connecting back surface 516 can be positioned inside the side surface 506, thereby reducing the length by which the engaging protrusion 651 extends beyond the side surface 506. Thus, the probe 51 can be easily inserted through the guide holes 311 and 312.

Similarly, the thickness of the second connecting portion 610 is thinner than that of the rod body 600, and the second connecting surface 615 is formed as a recessed surface compared to the side surface 605 of the rod body 600. This allows the first connecting surface 515 to be positioned inside the side surface 605, thereby minimizing the total thickness of the connected first connecting portion 510 and second connecting portion 610. Thus, the probe 51 can be easily inserted through the guide holes 311 and 312.

The width of the first connecting portion 510 is equal to or less than the width of the probe body 500, and the first connecting portion 510 is positioned within the outline of the cross-section of the probe body 500 when viewed from the axial direction.

Therefore, the first connecting portion 510 does not obstruct the insertion of the probe 51 through the guide holes 311 and 312.

Figure 12:
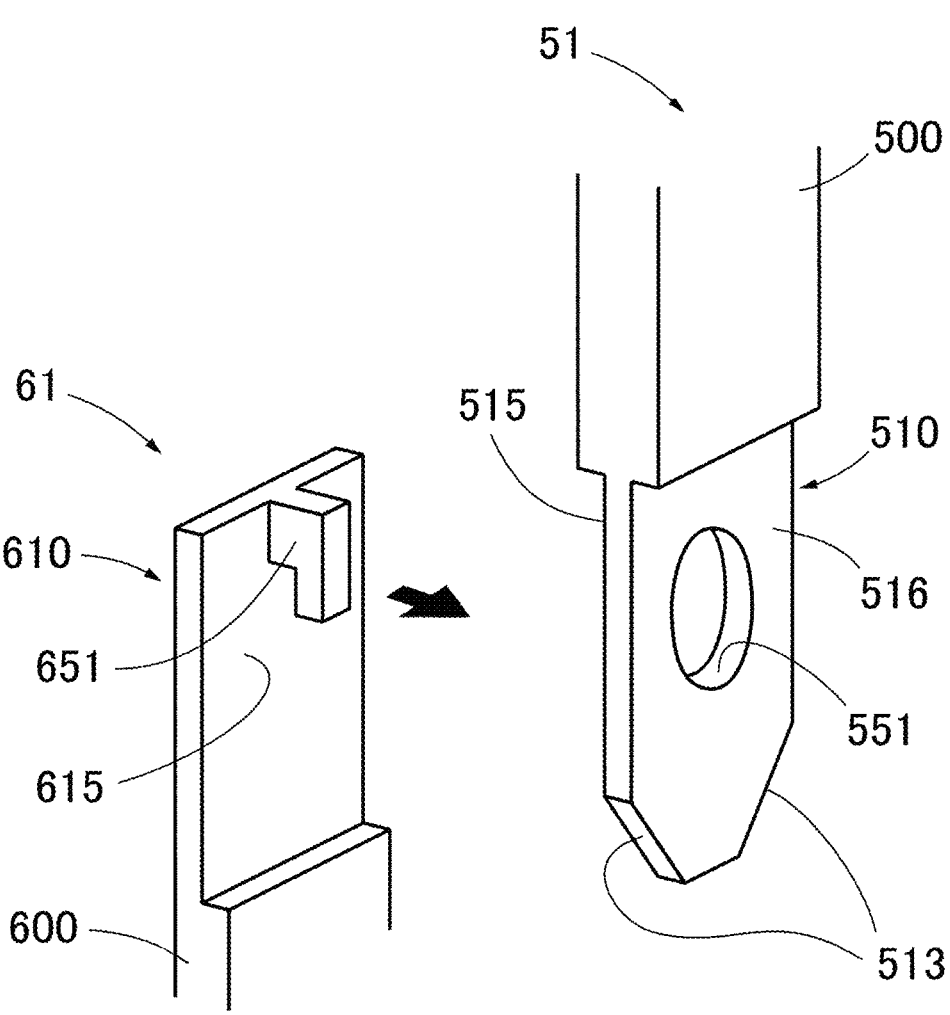
FIG. 12 is a diagram showing another configuration example of a probe 51 according to the second embodiment of the present invention.

FIG. 12 is a diagram showing another configuration example of a probe 51 according to the second embodiment of the present invention, illustrating the detailed configuration of the connecting portions 510 and 610. The probe 51 in FIG. 12 differs from the probe 51 in FIG. 11 only in that it has a tapered shape with a cross-sectional area that decreases towards the tip.

The thickness of the first connecting portion 510 is constant, and a tapered side surface 513 intersects with the first connecting surface 515, inclining with respect to the axial direction Da. The width of the first connecting portion 510 narrows towards the tip. As a result, the cross-sectional area decreases towards the tip.

By tapering the tip of the first connecting surface 515, the insertion of the probe 51 through the guide holes 311 and 312 can be facilitated.

Figure 13:
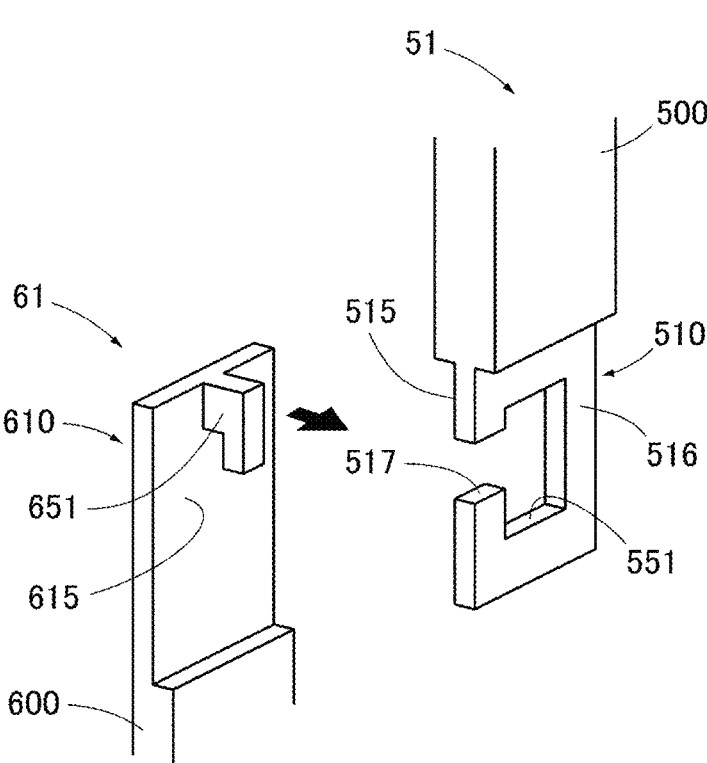
FIG. 13 is a diagram showing yet another configuration example of the probe 51 according to the second embodiment of the present invention.

FIG. 13 is a diagram showing yet another configuration example of the probe 51 according to the second embodiment of the present invention, illustrating the detailed configuration of the connecting portions 510 and 610. While the probe 51 in FIG. 11 has a circular engaging hole 551, the probe 51 in FIG. 13 differs in that it has a rectangular engaging hole 551 with a part of the engaging hole 551 being open.

The shape of the engaging hole 551 may be circular, rectangular, or any other arbitrary shape. The engaging hole 551 does not need to be completely enclosed by edges and may have, for example, an open portion 517 that breaks a part of the horizontal edge. The illustrated engaging hole 551 also has a hook shape formed in the plane intersecting with the engaging protrusion 651.

Third Embodiment

In the above embodiments, examples of methods for connecting the probes 50, 51 and the pulling rods 60, 61 using engaging protrusions 550, 651 and engaging holes 650, 551 are described. In the third embodiment, another method for connecting the probe and the pulling rod will be described.

Figure 14:
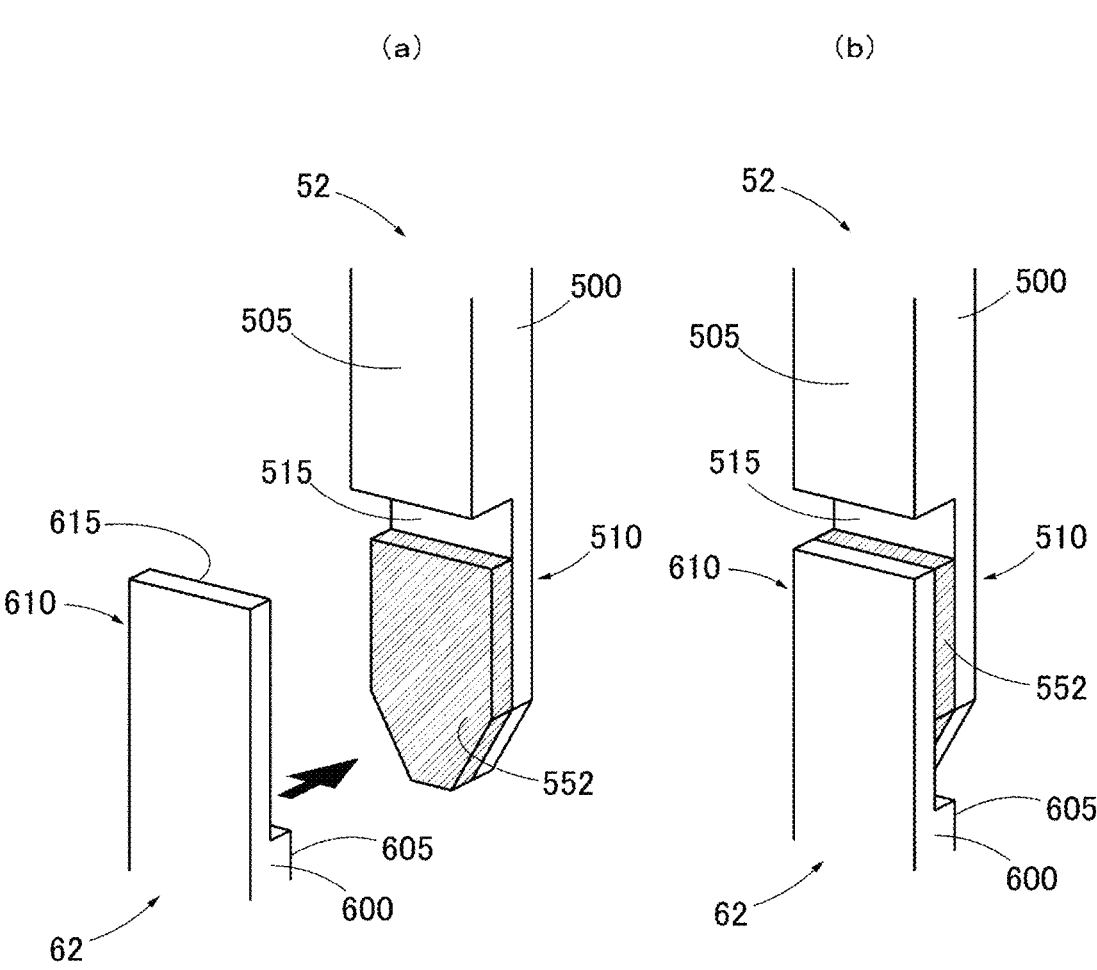
FIG. 14 is a diagram showing an example of a method for inserting a probe according to the third embodiment of the present invention.

FIG. 14 is a diagram showing an example of a method for inserting a probe according to the third embodiment of the present invention, illustrating an example of the detailed configuration of the first connecting portion 510 of the probe 52 and the second connecting portion 610 of the pulling rod 62. Part (a) of the figure shows the state before connection, and part (b) shows the state after connection. Compared to the probe 50 and the pulling rod 60 of the first embodiment in FIG. 6, the configuration of the first connecting portion 510 and the second connecting portion 610 differs for the probe 52 and the pulling rod 62. Other configurations are the same as those of the probe 50, so redundant explanations are omitted.

A solder layer 552 is formed on the first connecting surface 515. The solder layer 552 can be formed by plating, allowing it to be incorporated during the manufacturing process of the probe 52.

By joining the first connecting surface 515 and the second connecting surface 615 through the solder layer 552, the probe 52 and the pulling rod 62 can be detachably connected. For example, by heating the pulling rod 62 while the second connecting surface 615 is in contact with the solder layer 552 and melting the solder layer 552, the probe 52 and the pulling rod 62 can be connected. The insertion of the probe 52 through the guide holes 311 and 312 is performed after the temperature of the pulling rod 62 has decreased. After the insertion of the probe, the pulling rod 62 can be reheated to melt the solder layer 552 again, allowing the probe 52 and the pulling rod 62 to be separated.

The first connecting surface 515 is formed recessed compared to the side surface 505 of the probe body 500, and the second connecting surface 615 is formed recessed compared to the side surface 605 of the rod body 600. This is similar to the configuration of the probe 50 and the pulling rod 60 in FIG. 6.

In this embodiment, an example where the connection is made using the solder layer 552 is described. However, the present invention is not limited to such a configuration. For example, the connection may also be made using an adhesive layer with a thermoplastic adhesive.

In this embodiment, an example is described where the solder layer 552 is formed on the first connecting surface 515 and the pulling rod 62 is heated. However, the present invention is not limited to such a configuration. For example, the solder layer 552 may be formed on the second connecting surface 615, and the probe 52 may be heated instead.

Fourth Embodiment

In the above embodiments, examples of the probe 50 inserted into the guide unit 30 from the upper guide plate 301 side are described. In the fourth embodiment, the probe 53 inserted into the guide unit 30 from the lower guide plate 302 side will be described.

Figure 15:
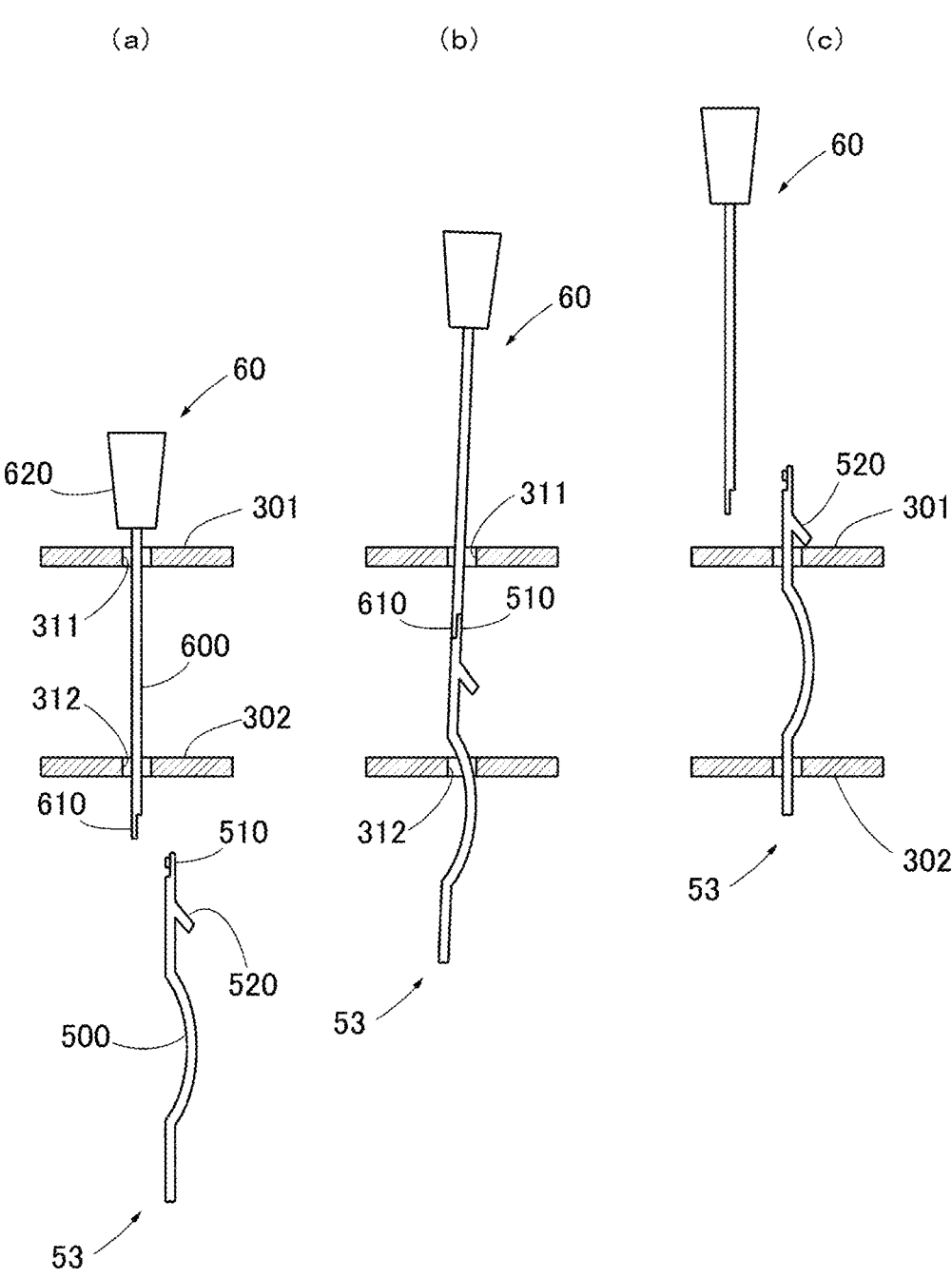
FIG. 15 is a diagram showing an example of a method for inserting a probe 53 according to the fourth embodiment of the present invention.

FIG. 15 is a diagram showing an example of a method for inserting a probe 53 according to the fourth embodiment of the present invention. Parts (a) to (c) in the figure show the process of attaching the probe 53 to the guide unit 30 using the pulling rod 60 in chronological order. The probe attachment process shown in the figure is part of the manufacturing process of the probe card and also part of the repair process for replacing a damaged probe 53 in the probe card.

The probe 53 differs from the probe 50 of the first embodiment in FIG. 2 in that the first connecting portion 510 is provided at the upper end of the probe body 500, and the stopper 520 can insert through the guide holes 311 and 312 from the lower side to the upper side. Other configurations are the same as those of the probe 50, so redundant explanations are omitted.

The first connecting portion 510 is a connecting member for detachably connecting the pulling rod 60. The first connecting portion 510 is formed as a protruding part that protrudes in the axial direction, that is, in a substantially vertical direction from the tip of the upper rod 501 from the upper end of the probe body 500. The pulling rod 60 is connected to face the side surface of the first connecting portion 510.

The stopper 520 is configured to pass through the guide holes 311 and 312 when moving upward but not when moving downward. For example, the stopper 520 is made of an elastically deformable member extending diagonally downward from the side surface of the upper rod 501. When inserted into the guide holes 311 and 312 from below, it elastically deforms to reduce its protrusion, allowing it to pass through the guide holes 311 and 312. Conversely, if inserted from above, it elastically deforms to increase its protrusion, preventing it from passing through the guide holes 311 and 312. Therefore, after passing through the guide holes 311 and 312 from below to above, the stopper 520 engages with the upper surface of the upper guide plate 301. In this embodiment, the example where the stopper 520 engages with the upper surface of the upper guide plate 301 is described. However, it is also possible to adopt a configuration where, for example, the stopper 520 passes through only the lower guide hole 312 from below to above and engages with the upper surface of the lower guide plate 302.

Part (a) of the figure shows the state where the pulling rod 60 has been inserted through the upper guide hole 311 and further through the lower guide hole 312. The pulling rod 60 is inserted through the guide holes 311 and 312 from the top side.

Part (b) of the figure shows the state where the connecting portion 610 of the pulling rod 60 protrudes below the lower guide plate 302, and the probe 53 is connected to the pulling rod 60. It also shows the process of pulling the pulling rod 60 out of the guide holes 311 and 312. As the pulling rod 60 is moved upward, the probe 53 is also pulled upward by the pulling rod 60. Thus, the probe 53 is inserted through the lower guide hole 312 and further through the upper guide hole 311.

Part (c) of the figure shows the state after the pulling rod 60 has been detached. When the pulling rod 60 is moved upward, it is completely withdrawn from the guide holes 311 and 312, and the first connecting portion 510 and the second connecting portion 610 also pass through the upper guide hole 311, emerging above the guide plate 301. In this state, if the pulling rod 60 is detached from the probe 53, the stopper 520 engages with the upper surface of the upper guide plate 301, leaving the probe 53 in a state of being inserted through the guide holes 311 and 312.

If necessary, the first connecting portion 510 may be removed by rubbing the upper end of the probe 53 with a cleaning sheet.

REFERENCE SIGNS LIST

1 PROBE CARD
10 MAIN SUBSTRATE
101 EXTERNAL TERMINAL
102 PROBE ELECTRODE
103 REINFORCING PLATE
20 CARD HOLDER
21 STAGE
211 SEMICONDUCTOR WAFER
212 ELECTRODE TERMINAL
213 BUMP ELECTRODE
30 GUIDE UNIT
301 UPPER GUIDE PLATE
302 LOWER GUIDE PLATE
303 CONNECTING SPACER
311 UPPER GUIDE HOLE
312 LOWER GUIDE HOLE
40 MOUNTING SPACER
50-53 PROBE
55, 56 PROBE
500 PROBE BODY
501 UPPER ROD
502 LOWER ROD
503 CURVED PORTION
505, 506 SIDE SURFACE OF PROBE BODY
510 FIRST CONNECTING PORTION
513 TAPERED SURFACE
515 FIRST CONNECTING SURFACE
516 CONNECTING BACK SURFACE
517 OPEN PORTION
520 STOPPER
550 ENGAGING PROTRUSION
551 ENGAGING HOLE
552 SOLDER LAYER

15

560 CONNECTING SPACE
60-62 PULLING ROD
600 ROD BODY
605 SIDE SURFACE OF ROD BODY
610 SECOND CONNECTING PORTION
615 SECOND CONNECTING SURFACE
620 HANDLE
650 ENGAGING HOLE
651 ENGAGING PROTRUSION
70 CLEANING SHEET
700 SUBSTRATE
701, 702, 704 CONDUCTIVE LAYER
703 SACRIFICIAL LAYER
Da AXIAL DIRECTION
Dt THICKNESS DIRECTION
Dw WIDTH DIRECTION

The invention claimed is:

1. A method for inserting a probe for a probe card in which two guide plates are arranged apart from each other, and the probe is inserted through two guide holes respectively formed in the two guide plates, comprising:

inserting a rod used to pull the probe through the two guide holes;

attaching a tip of the probe to a tip of the rod with the rod inserted through the two guide holes;

pulling the rod, to which the probe is attached, in an opposite direction from when it was inserted through the two guide holes to remove it out of the two guide holes, thereby inserting the probe through the two guide holes; and detaching the rod from the probe after pulling it out of the two guide holes.

2. The method according to claim 1, wherein attaching the tip of the probe to the tip of the rod by overlapping them lengthwise.

3. The method according to claim 1, further comprising:

removing a portion of the probe to which the rod was attached after detaching the rod from the probe.

4. A probe, comprising:

an elastically deformable probe body to be inserted through two guide holes respectively formed in two guide plates arranged apart from each other; and a connecting portion protruding in an axial direction from one end of the probe body and configured to be connected to a tip of a rod used to pull the probe through the two guide holes, wherein the tip of the rod is detachably connected to a first connecting surface parallel to the axial direction of the connecting portion.

5. The probe according to claim 4, wherein the first connecting surface is provided at a position recessed from a side surface of the probe body, and a second connecting surface of the rod connected to the first connecting surface is positionable closer to the first connecting surface than the side surface of the probe body.

6. The probe according to claim 5, wherein solder or thermoplastic adhesive is formed on the first connecting surface or the second connecting surface.

7. The probe according to claim 5, wherein an engaging portion to be engaged with the pulling rod is provided on the first connecting surface.

8. The probe according to claim 7, wherein the engaging portion is a hook shape formed to protrude from the first connecting surface, with a tip facing the probe body.

9. The probe according to claim 7, wherein the engaging portion includes an engaging hole formed in the first connecting surface.

10. The probe according to claim 4, wherein the connecting portion has a tapered shape with a cross-sectional area decreasing towards a tip opposite the probe body.

11. The probe according to claim 5, wherein the connecting portion has a tapered shape with a cross-sectional area decreasing towards a tip opposite the probe body.

12. The probe according to claim 6, wherein the connecting portion has a tapered shape with a cross-sectional area decreasing towards a tip opposite the probe body.

13. The probe according to claim 7, wherein the connecting portion has a tapered shape with a cross-sectional area decreasing towards a tip opposite the probe body.

14. The probe according to claim 8, wherein the connecting portion has a tapered shape with a cross-sectional area decreasing towards a tip opposite the probe body.

15. The probe according to claim 9, wherein the connecting portion has a tapered shape with a cross-sectional area decreasing towards a tip opposite the probe body.

16. The method according to claim 2, further comprising:

removing a portion of the probe to which the rod was attached after detaching the rod from the probe.

* * * * *